(12) United States Patent
Gilchrist et al.

(10) Patent No.: US 11,108,356 B2
(45) Date of Patent: Aug. 31, 2021

(54) INTEGRATION OF MICROINVERTER WITH PHOTOVOLTAIC MODULE

(71) Applicant: Enphase Energy, Inc., Petaluma, CA (US)

(72) Inventors: Phil Gilchrist, Austin, TX (US); William Morris, Round Rock, TX (US); Kristine Little, Austin, TX (US); Patrick Chapman, Austin, TX (US); William P. Mulligan, Wilson, WY (US); Marco A. Marroquin, Austin, TX (US)

(73) Assignee: Enphase Energy, Inc., Petaluma, CA (US)

(*) Notice: Subject to any disclaimer, the term of this patent is extended or adjusted under 35 U.S.C. 154(b) by 289 days.

(21) Appl. No.: 16/011,384

(22) Filed: Jun. 18, 2018

(65) Prior Publication Data

US 2018/0302028 A1 Oct. 18, 2018

Related U.S. Application Data

(63) Continuation of application No. 14/554,825, filed on Nov. 26, 2014, now Pat. No. 10,008,979.

(Continued)

(51) Int. Cl.
*H02S 40/32* (2014.01)
*H02S 40/34* (2014.01)
(Continued)

(52) U.S. Cl.
CPC ........ *H02S 40/32* (2014.12); *H01L 31/02013* (2013.01); *H02S 40/34* (2014.12);
(Continued)

(58) Field of Classification Search
CPC ......... H02S 40/32; H02S 40/34; H05K 3/301; H05K 7/142; H05K 7/02; H05K 7/04; H01L 31/0213; Y02E 10/50
See application file for complete search history.

(56) References Cited

U.S. PATENT DOCUMENTS

| | | | |
|---|---|---|---|
| 3,198,873 A * | 8/1965 | Ryan | H01B 7/0072 174/47 |
| 6,201,180 B1 | 3/2001 | Meyer et al. | |

(Continued)

FOREIGN PATENT DOCUMENTS

| | | |
|---|---|---|
| CN | 202918180 | 5/2013 |
| CN | 103441648 | 12/2013 |

(Continued)

OTHER PUBLICATIONS

John Wiles, "The Microinverter and the AC PV Module", IAEI News, Mar.-Apr. 2010, pp. 22-27.

(Continued)

*Primary Examiner* — Matthew T Martin
(74) *Attorney, Agent, or Firm* — Moser Taboada

(57) ABSTRACT

Various technologies for integrating a microinverter with a photovoltaic module are disclosed. An alternating current photovoltaic (ACPV) module includes a photovoltaic module having a frame and a junction box including a direct current (DC) output connector, and a microinverter having a housing coupled to the frame and a DC input connector electrically mated with the DC output connector of the photovoltaic module.

10 Claims, 10 Drawing Sheets

Related U.S. Application Data

(60) Provisional application No. 61/909,706, filed on Nov. 27, 2013.

(51) Int. Cl.
    *H05K 3/30*     (2006.01)
    *H01L 31/02*     (2006.01)
    *H05K 7/14*     (2006.01)
    *H05K 7/02*     (2006.01)
    *H05K 7/04*     (2006.01)

(52) U.S. Cl.
    CPC ............... *H05K 3/301* (2013.01); *H05K 7/02* (2013.01); *H05K 7/04* (2013.01); *H05K 7/142* (2013.01); *Y02E 10/50* (2013.01)

(56) References Cited

U.S. PATENT DOCUMENTS

| | | | |
|---|---|---|---|
| 6,235,984 B1 | 5/2001 | Wambach | |
| 6,360,497 B1 | 3/2002 | Nakazima | |
| 7,530,830 B1 | 5/2009 | Lenox | |
| 7,708,578 B1 | 5/2010 | Lenox | |
| 7,708,579 B2 | 5/2010 | Lenox | |
| 8,435,056 B2 | 5/2013 | Fornage | |
| 8,523,586 B2 | 9/2013 | Eusterhotz | |
| 8,558,102 B2 | 10/2013 | Craft | |
| 2003/0111103 A1 | 6/2003 | Bower et al. | |
| 2008/0041434 A1 | 2/2008 | Adriani et al. | |
| 2008/0055810 A1 | 3/2008 | O'Roarke | |
| 2008/0283118 A1 | 11/2008 | Rotzoll et al. | |
| 2008/0291609 A1 | 11/2008 | Victor et al. | |
| 2009/0084426 A1 | 4/2009 | Fornage | |
| 2010/0147362 A1 | 6/2010 | King et al. | |
| 2010/0263704 A1 | 10/2010 | Fornage et al. | |
| 2010/0297860 A1 | 11/2010 | Shmukler et al. | |
| 2011/0083733 A1* | 4/2011 | Marroquin | H01L 31/0201 136/256 |
| 2012/0031470 A1 | 2/2012 | Dimov | |
| 2012/0127770 A1 | 5/2012 | Kim et al. | |
| 2012/0210543 A1 | 8/2012 | Lin | |
| 2012/0255596 A1* | 10/2012 | Korman | H02S 40/34 136/251 |
| 2012/0279747 A1 | 11/2012 | Sella | |
| 2012/0315783 A1 | 12/2012 | Wiest et al. | |
| 2013/0075152 A1* | 3/2013 | Mazzone | H02G 3/04 174/481 |
| 2013/0271926 A1 | 10/2013 | Marroquin | |
| 2014/0090696 A1* | 4/2014 | Rodrigues | H02S 40/32 136/251 |
| 2014/0266289 A1* | 9/2014 | Della Sera | H02J 3/381 324/761.01 |
| 2015/0188489 A1 | 7/2015 | Marroquin | |

FOREIGN PATENT DOCUMENTS

| | | |
|---|---|---|
| DE | 4032569 A1 | 4/1992 |
| DE | 202011002938 U1 | 5/2012 |
| WO | WO-2009088977 A1 | 7/2009 |

OTHER PUBLICATIONS

Australian Patent Examination Report dated Mar. 27, 2018 for Patent Application No. 2014354752.
European Search Report dated Oct. 9, 2018 for PCT Application No. 14865954.3.
John Wiles, "The Microinverter and the AC PV Module", IAEI News Mar.-Apr. 2010.
International Search Report and Written Opinion for application No. PCT/US2014/067630, dated Mar. 6, 2015, 9 pages.
International Search Report and Written Opinion for application No. PCT/US2014/072809, dated Apr. 23, 2015, 9 pages.
Extended European Search Report for Application No. 14876045.7 dated Feb. 20, 2017 (9 pages).

* cited by examiner

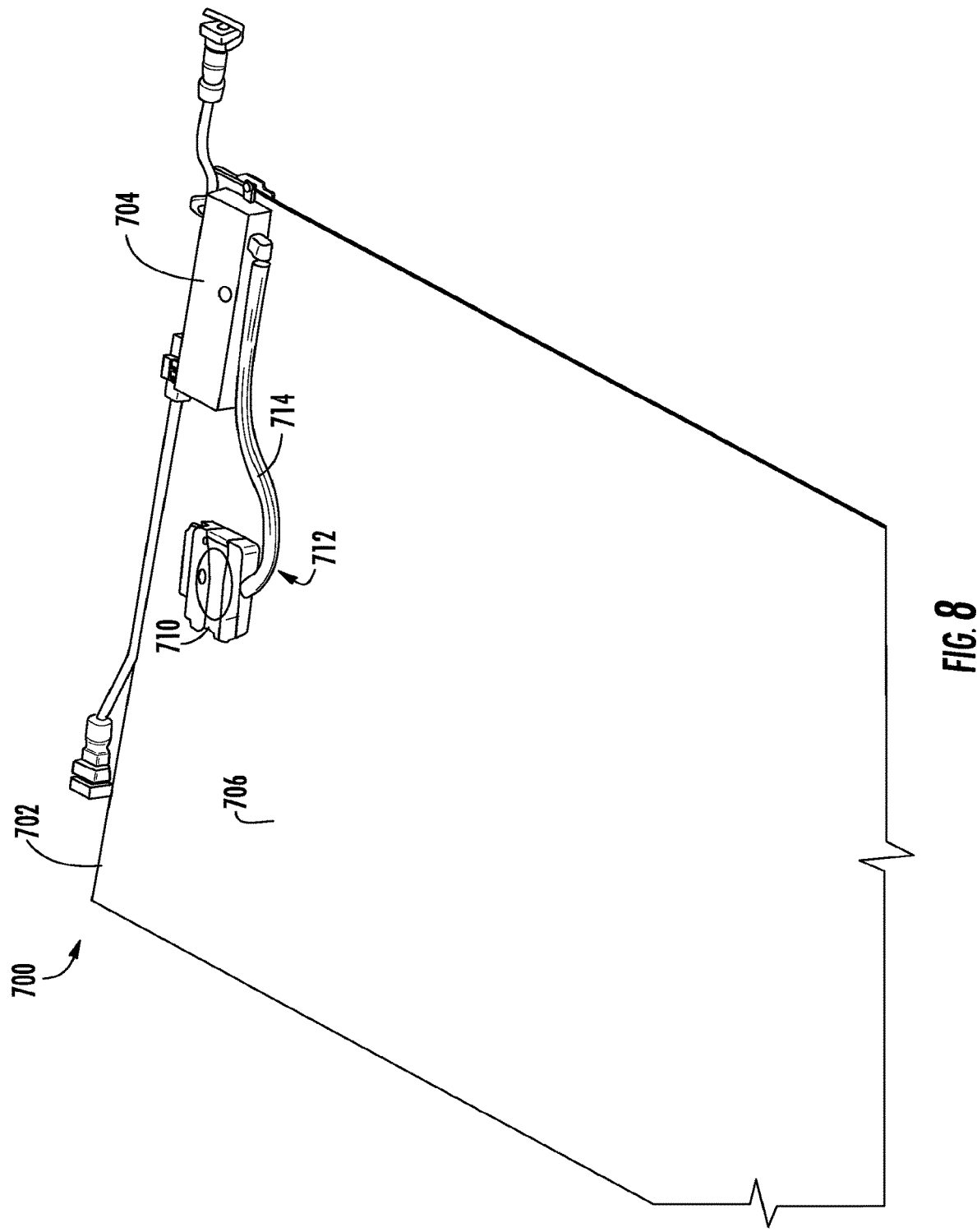

INTEGRATION OF MICROINVERTER WITH PHOTOVOLTAIC MODULE

CROSS REFERENCE TO RELATED U.S. APPLICATIONS

This application is a continuation of U.S. application Ser. No. 14/554,825, which was filed on Nov. 26, 2014, is now U.S. Pat. No. 10,008,979, and is entitled "INTEGRATION OF MICROINVERTER WITH PHOTOVOLTAIC MODULE." The '825 application claims priority to and the benefit of U.S. Provisional Patent Application Ser. No. 61/909,706 entitled "INTEGRATION OF MICROINVERTER WITH PHOTO VOLTAIC MODULE," which was filed on Nov. 27, 2013, the entirety of which is incorporated herein by reference.

GOVERNMENT RIGHTS

This invention was made in part with government support under Grant No. DE-EE0005341 awarded by the Department of Energy. The Government has certain rights in this invention.

TECHNICAL BACKGROUND

The present disclosure relates, generally, to photovoltaic (PV) modules and, more particularly, to photovoltaic modules having a power inverter for converting direct current (DC) power generated by the PV module to alternating current (AC) power integrated therewith.

BACKGROUND

A typical DC PV module generally includes a rectangular frame (typically aluminum), a PV laminate, and a junction (j-) box. The (typically plastic) j-box encapsulates the electrical connections protruding from the backsheet of the laminate, providing wired connections to the j-box. Such wires are normally of double-insulated type having rugged connectors, commonly known as "MC-4" connectors. The wires and connectors are commonly known as PV wire or PV cables, and such wires/cables carry the DC power from the module to an external circuit. In many cases, the j-box is glued to the laminate backsheet. Standard (silicon) modules typically have 60 or 72 solar cells, arranged electrically in three or four series-connected "substrings." Each substring will typically have an equal number of cells (e.g., 20 cells for a 60-cell module) and a diode placed in parallel with the series cells. Such diodes, commonly known as bypass diodes, are normally located in the j-box as well.

In particular applications, the DC power generated by a DC PV module may be converted to AC power through the use of a DC-to-AC power inverter. The power inverter may be electrically coupled to the DC output of the PV module (i.e., the PV cables). The power inverter may be located physically apart from the PV module, with only the intervening wiring and associated hardware physically coupling the PV module to the power inverter.

SUMMARY OF THE DISCLOSURE

According to one aspect, an alternative current photovoltaic (ACPV) module includes a photovoltaic module and a microinverter. The photovoltaic module includes a frame and a junction box having a direct current (DC) output connector. The microinverter has a housing coupled to the frame and a DC input connector electrically mated with the DC output connector of the photovoltaic module.

In some embodiments, the housing of the microinverter may be elongated and may include a plurality of mounting tabs secured to the frame of the photovoltaic module. The DC output connector of the junction box may extend upwardly from a substrate of the photovoltaic module, and the DC input connector of the microinverter may extend downwardly from the housing of the microinverter toward the substrate.

In some embodiments, the frame of the photovoltaic module may include a pair of side rails extending inwardly from the frame to define an opening of the frame, each of the side rails may include a track defined therein, the housing of the microinverter may include a pair of slide guides, and each slide guide may be received in a corresponding track of the side rails of the frame of the photovoltaic module. A backplate of the microinverter may be aligned with the frame of the photovoltaic module when the DC input connector of the microinverter is electrically mated with the DC output connector of the junction box of the photovoltaic module, and an alternating current (AC) cable connector of the microinverter may protrude from the backplate.

In some embodiments, the ACPV module may comprise a support bracket coupled to a first frame member and a second frame member of the frame of the photovoltaic module, and the first and second frame members may define a corner of the frame. The housing of the microinverter may be secured to the support bracket. The housing of the microinverter may include a plurality of mounting flanges extending outwardly therefrom, the support bracket may include a plurality of retainers, and at least one of the mounting flanges may cooperate with one of the plurality of retainers to secure the housing to the support bracket.

According to another aspect, an alternating current photovoltaic (ACPV) module includes a photovoltaic module and a microinverter. The photovoltaic module includes a solar cell array and an electrical terminal extending from a back substrate that is electrically connected to the solar cell array. The microinverter has a housing secured to the photovoltaic module, and the housing includes a connection chamber. The electrical terminal of the photovoltaic module is received in the connection chamber and electrically connected to a direct current (DC) input terminal of the microinverter.

In some embodiments, the photovoltaic module may be frameless. Additionally, in some embodiments, the housing of the microinverter may include a base, a cover coupled to the base, and a gasket positioned between the base and the cover.

In some embodiments, the photovoltaic module may include a frame, and the housing of the microinverter may be secured to the frame of the photovoltaic module toward a corner of the frame. Additionally, in some embodiments, the photovoltaic module may include a frame, and the housing of the microinverter may be secured to the frame of the photovoltaic module so that the microinverter is centered between two corners of the frame. In some embodiments still, the photovoltaic module may include a frame, the housing of the microinverter may include a plurality of mounting flanges extending outwardly therefrom, and the plurality of mounting flanges may be secured to the frame of the photovoltaic module. The microinverter may be secured to the frame of the photovoltaic module via the plurality of mounting flanges in a configuration such that the microinverter applies a substantially zero net force to the back substrate of the photovoltaic module.

According to yet a further aspect, an alternating current photovoltaic (ACPV) module includes a photovoltaic module and a microinverter. The photovoltaic module has a junction box. The microinverter has a housing secured to the photovoltaic module. The microinverter is directly electrically connected to the junction box of the photovoltaic module via a connector-less direct current (DC) wire assembly.

In some embodiments, the photovoltaic module may be frameless. The connector-less DC wire assembly may be positioned in a flexible conduit.

In some embodiments, the photovoltaic module may include a frame, and the housing of the microinverter may be secured to the frame of the photovoltaic module. The housing of the microinverter may be secured to the frame of the photovoltaic module toward a corner of the frame. Additionally, in some embodiments, the photovoltaic module may include a frame, and the connector-less DC wire assembly may be positioned in a flexible conduit.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

FIG. 8 is a simplified illustration of at least one additional embodiment of the ACPV module of FIG. 7 having the microinverter attached to a substrate of a frameless PV module;

DETAILED DESCRIPTION OF THE DRAWINGS

Figure 1:
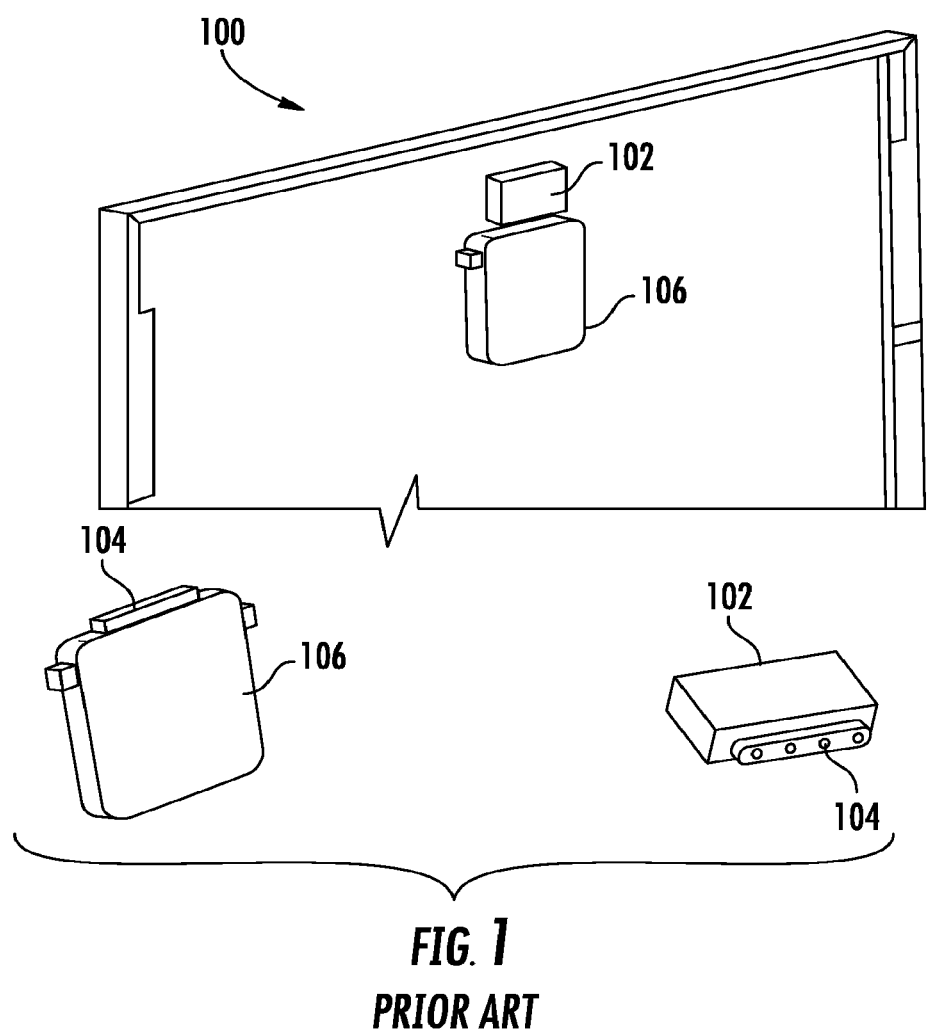
FIG. 1 is a simplified illustration of at least one embodiment of an ACPV module including a microinverter attached to a substrate of the ACPV module.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); or (A, B, and C). Similarly, items listed in the form of "at least one of A, B, or C" can mean (A); (B); (C): (A and B); (B and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIGS. 1-10, the present disclosure relates to various embodiments of ACPV modules in which a DC-AC inverter, commonly referred to as a "microinverter," is attached to the PV module in different configurations to form the ACPV module. In some typical ACPV module implementations, the junction box of the PV module is completely replaced with the microinverter. In such implementations, the hardware for the microinverter and the typical junction box wiring and connectors may share the same housing structure. The output leads or cables from the microinverter carry AC rather than the DC power generated by the PV module. However, typical microinverters are relatively heavy and complex compared to the simple circuit board normally included in a standard junction box (which only provides wire connections and 3-4 bypass diodes). The weight of a typical microinverter can make it difficult to maintain a reliable bonding to the backsheet substrate of the PV module with glue over the life of the ACPV module. The weight of the typical microinverter also can cause the PV module to delaminate, resulting in a module failure. Additionally, the repair of the microinverter or module itself is generally more difficult. For example, if an ACPV module microinverter fails, it may be difficult or impossible to replace just the microinverter, causing the loss of both the microinverter and the PV module. Further, grounding of the microinverter and PV module may pose additional challenges.

One embodiment of an ACPV module that has been implemented to address the challenges of the typical ACPV module discussed above is shown in FIG. 1. In that embodiment, an ACPV module 100 includes a "dock" connection formed from a junction box 102 and a microinverter 106. The junction box 102 includes a DC output connector 104, instead of the standard DC PV wires. A microinverter 106 has a DC input connector 108 corresponding to the DC output connector 104 of the junction box 102 such that the microinverter 106 may be electrically coupled to the junction box 102 as shown in FIG. 1. Because the junction box 102 and the microinverter 106 are coupled together directly, the need for DC wires is removed, which may increase the ease of repair and replacement of the microinverter. The dock connection of the ACPV module 100, somewhat reminiscent of a USB connector, also allows other electronics to be easily attached, so that the module vendor can easily multiply-source the socket. To further support the weight of the microinverter 106, a support bracket may be included to secure the microinverter 106 to a frame of the ACPV module 100, which may also facilitate the grounding of the microinverter 106. One embodiment of such a frame-mounted dock-connected ACPV module is described in U.S. Pat. No. 8,462,518, entitled "Power Inverter Docking System for Photovoltaic Module," by Marco A. Marroquin et al., which was filed on Oct. 30, 2009.

Figure 2:
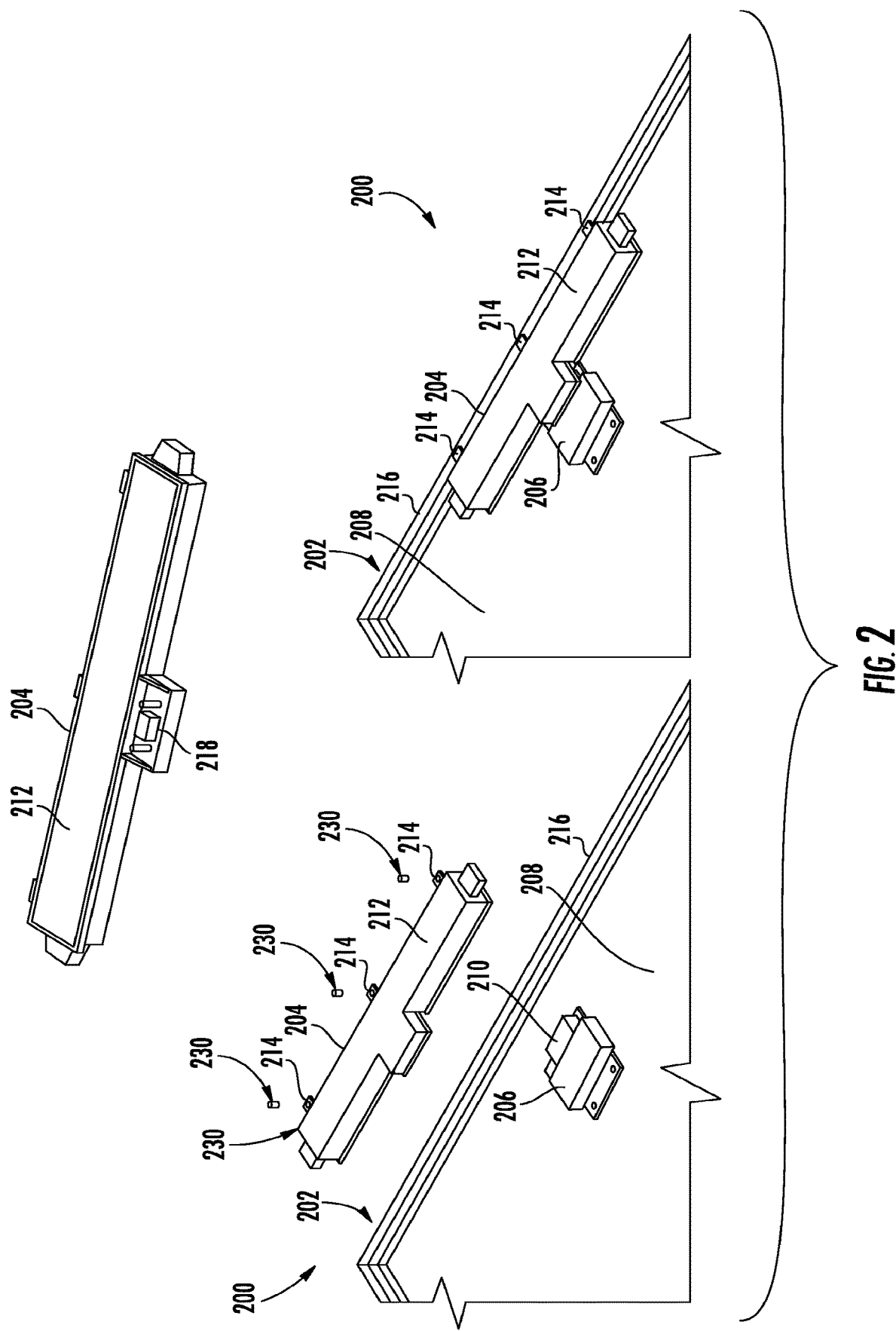
FIG. 2 is a simplified illustration of at least one additional embodiment of an ACPV module including a microinverter secured to a frame of the ACPV module.

Referring now to FIG. 2, in the illustrative embodiment, an ACPV module 200 includes a PV module 202 and a microinverter 204. The PV module 202 includes a junction box 206 secured to a backsheet of a substrate 208 of the PV module 202. The junction box 206 includes a DC output connector 210. The microinverter 204 includes an elongated housing 212 having a plurality of mounting tabs 214 extending from the housing 212 and positioned thereon to facilitate attachment of the microinverter 204 to a frame 216 of the PV module 202, which can also facilitate grounding of the microinverter 204. Each of the mounting tabs 214 includes an aperture sized to receive one of a plurality of fasteners 230, and the frame 216 similarly includes a plurality of apertures sized to receive the fasteners 230. The fasteners 230 are inserted into the respective apertures of the mounting tabs 214 and the frame 216 to attach the housing 212 of the microinverter 204 to the frame 216. It should be appreciated that the DC output connector 210 extends upwardly from the substrate 208 of the PV module 202 to facilitate a vertical connection with a corresponding DC input connector 218 of the microinverter 204, which extends downwardly from the elongated housing 212.

It should be appreciated that, because the mounting tabs 214 are integrated with, or otherwise coupled to, the elongated housing 212, a separate mounting bracket to secure the microinverter 204 to the frame 216 is not needed. Additionally, although the housing 212 is shown as elongated, the shape and size of the housing 212 may vary in other embodiments while still facilitating attachment of the housing 212 to the frame 216 as discussed above. Further, it should be appreciated that the placement of the junction box 206 on the substrate 208 and the physical dimensions of the microinverter 204 are interdependent and, as such, the location of the junction box 206 may be adjusted or modified depending on the particular microinverter used.

Figure 3:
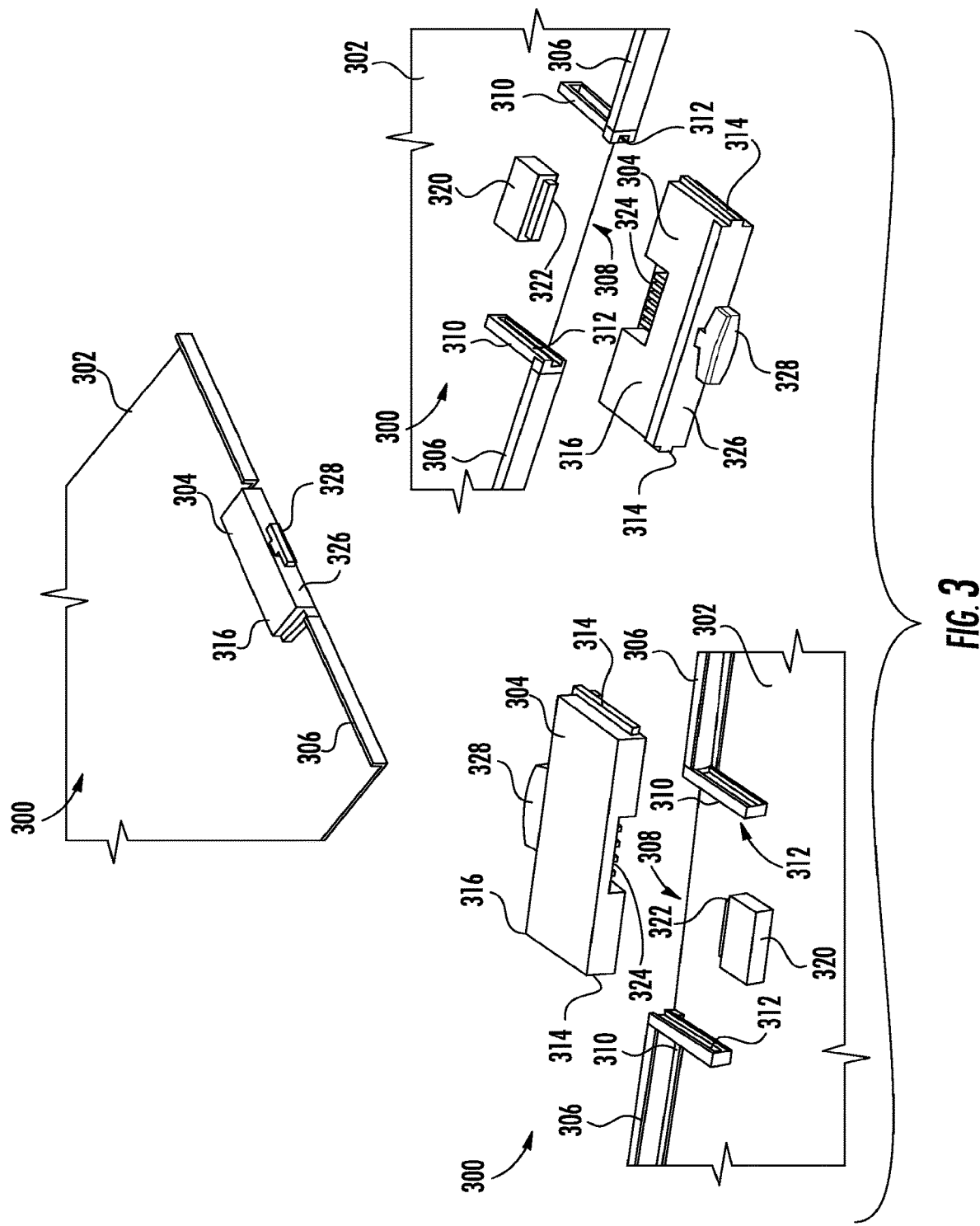
FIG. 3 is a simplified illustration of at least one additional embodiment of an ACPV module including a microinverter secured to the frame of the ACPV module via associated siderails of the frame.

Referring now to FIG. 3, in the illustrative embodiment, an ACPV module 300 includes a PV module 302 and a microinverter 304. As shown, the microinverter 304 is configured to attach to the PV module 302 via a slide-docking mechanism. To support the attachment of the microinverter 304, the PV module 302 includes a frame 306 having an opening 308 defined therein and including a pair of siderails 310 extending inwardly from the frame 306, which define the opening 308. Each siderail 310 includes a track 312 configured to receive a corresponding slide guide 314 extending outwardly from a housing 316 of the microinverter 304. The microinverter 304 may be attached to the PV module 302 by sliding the slide guides 314 in the corresponding tracks 312 of the siderails 310 as shown in FIG. 3. In some embodiments, the siderails 310 and/or the slide guides 314 may include a locking mechanism to lock, or otherwise secure, the microinverter 304 in place.

The PV module 302 includes a junction box 320 aligned with the opening 308 of the frame 306. The junction box 320 includes a DC output connector 322, which is positioned to be received by a corresponding DC input connector 324 of the microinverter 304 as the microinverter 304 is slid into the opening 308 of the frame 306 via cooperation of the tracks 312 and slide guides 314. In the illustrative embodiment of FIG. 3, the microinverter 304 includes a backplate 326, which is aligned with the frame 306 when the microinverter 304 is secured to the PV module 302. Additionally, an AC cable connector 328 protrudes from the backplate 326 to provide easy access for installation of the ACPV module 300.

Figure 4:
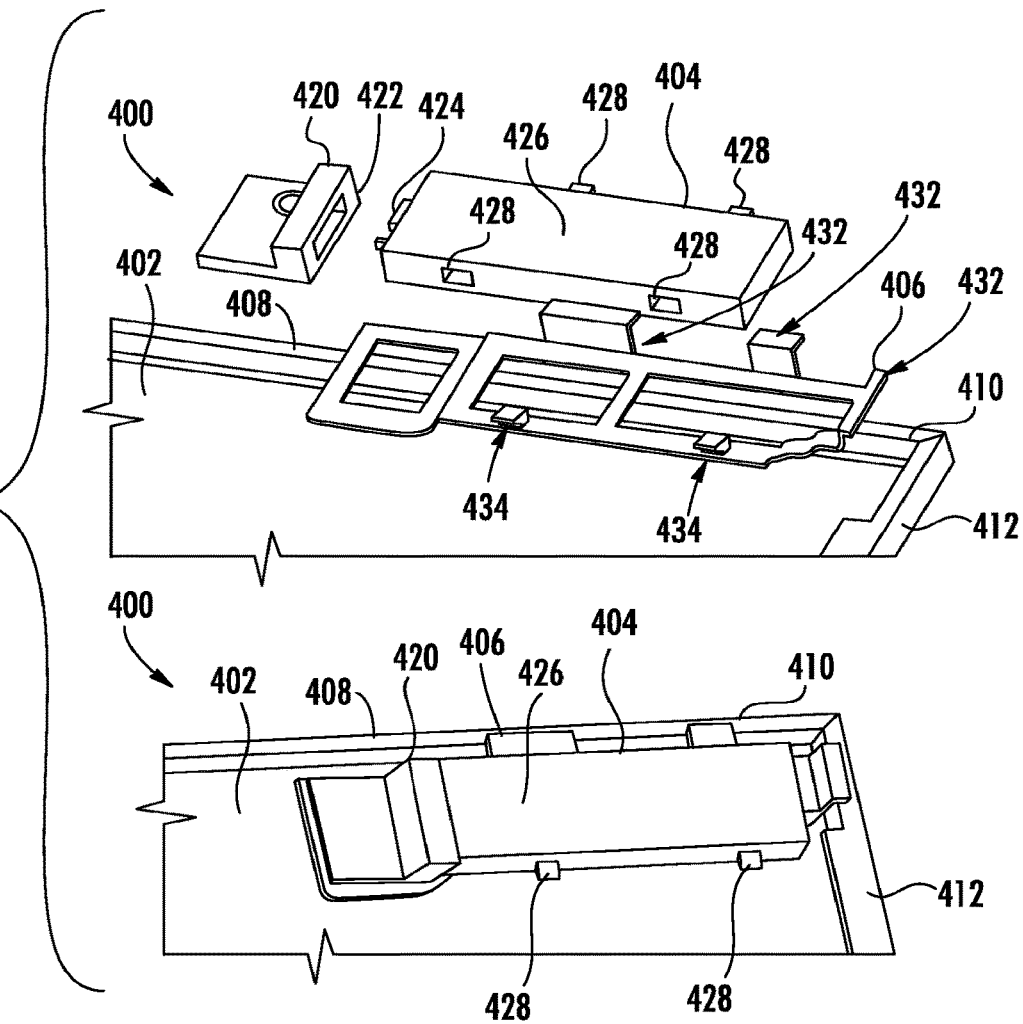
FIG. 4 is a simplified illustration of at least one additional embodiment of an ACPV module including a microinverter attached to a substrate and frame of the ACPV module via a separate mounting bracket.

Referring now to FIG. 4, in the illustrative embodiment, an ACPV module 400 includes a PV module 402, a microinverter 404, and a support bracket 406. The support bracket 406 is designed to facilitate attachment of the microinverter 404 toward a corner of a frame 408 of the PV module 402. That is, to secure the support bracket 406 in place toward the corner of the frame 408 as shown in FIG. 4, a plurality of clips 432 of the support bracket 406 may be affixed to two orthogonal frame members 410, 412 of the frame 408 via fasteners or an adhesive and/or thermal coupling. The PV module 402 includes a junction box 420 having a DC output connector 422 that is configured to couple to a DC input connector 424 of the microinverter 404 when the microinverter 404 is secured to the support bracket 406. The position and orientation of the junction box 420 may depend on the physical dimensions of the microinverter 404 and, as such, may be modified based on the particular microinverter 404 used. In the illustrative embodiment, the junction box 420 is located toward a corner of the frame 408 and rotated to face the side frame member 412, and the junction box 420 is affixed to the support bracket 406 via fasteners or an adhesive coupling. Additionally, in the illustrative embodiment, the microinverter 404 includes a housing 426 having a plurality of mounting flanges 428 extending outwardly therefrom, which facilitate attachment of the microinverter 404 to the support bracket 406 (and the frame 408 in some embodiments). Specifically, at least one of mounting flanges 428 of the housing 426 cooperates with one of a plurality of retainers 434 of the support bracket 406 to attach the microinverter 404 to the support bracket 406. In place of, or in addition to, the mounting flanges 428 and the plurality of retainers 434, the housing 426 may be affixed to the support bracket 406 via fasteners or an adhesive and/or thermal coupling. However, in other embodiments, the ACPV module 400 may not include the support bracket 406. In such embodiments, the microinverter 404 may be secured directly to the frame 408 (e.g., each of the frame members 410, 412).

Figure 5:
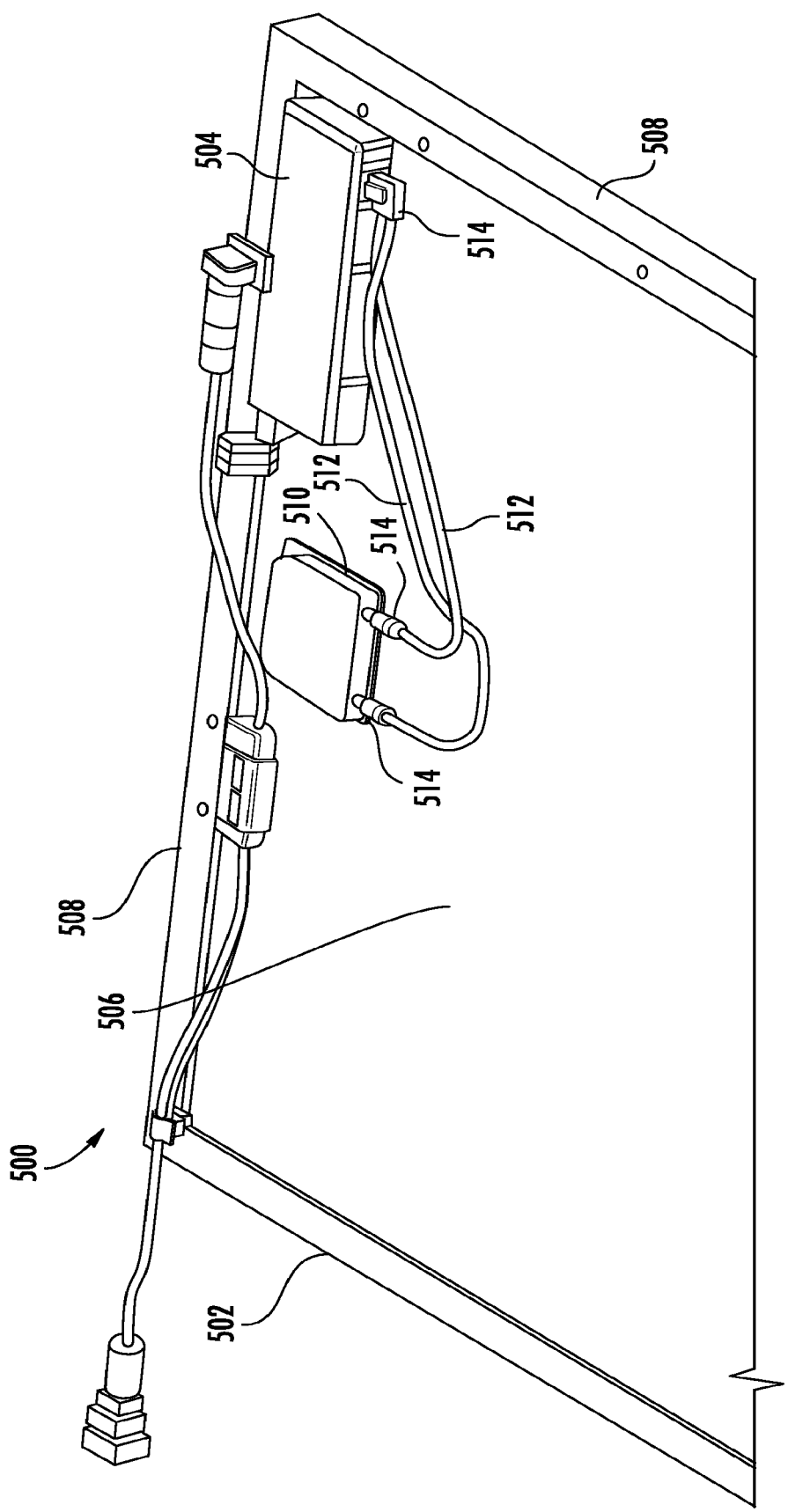
FIG. 5 is a simplified illustration of at least one additional embodiment of an ACPV module including a microinverter attached to a frame of the ACPV module toward a corner of a substrate of the ACPV module.

Referring now to FIG. 5, in the illustrative embodiment, an ACPV module 500 includes a PV module 502 and a microinverter 504 secured to a back substrate 506 of the PV module 502. As shown, the microinverter 504 is secured to the PV module 502 toward a corner of a frame 508 of the PV module 502, and may be secured to the frame 508 directly or via an additional supporting bracket as discussed above with regard to the embodiment of FIG. 4. In the illustrative embodiment of FIG. 5, the microinverter 504 is directly electrically connected to a junction box 510 of the PV module 502 via DC wires or cables 512. However, unlike a standard PV module, the connection between the junction box 510 and the microinverter 504 is formed without the use of DC connectors (e.g., MC-4 connectors). The connection between the junction box 510 and the microinverter 504 is therefore established through the use of a connector-less DC wire assembly (e.g., DC wires 512). For instance, the microinverter 504 and junction box 510 may be "hardwired" together such that the DC cables 512 are not capable of being unplugged or disconnected from the junction box 510 or the microinverter 504. To provide an amount of protection, the DC cables 512 may include a strain relief 514 at each terminal end toward the junction box 510 and microinverter 504. The microinverter 504 and junction box 510 may be electrically connected together by soldering, or otherwise electrically connecting, the wires of the DC cables 512 within the microinverter 504 and the junction box 510. In some embodiments, an access box or panel (not shown) may be provided in the junction box 510 to allow field service of the ACPV module 500 (e.g., to allow access to the connections of the DC cable 512 within the junction box 510). Additionally or alternatively, the microinverter 504 may include an access panel or box (not shown) to allow field service of the ACPV module 500 (e.g., to allow access to the connections of the DC cable 512 within the microinverter 504). In such embodiments, the module vendor may supply the PV module 502 without MC-4 connectors, and the ACPV module integrator would complete manufacture of the ACPV module 500 by soldering, or otherwise electrically connecting, the DC cables 512 directly to electrical connection points inside the microinverter 504.

Figure 6A:
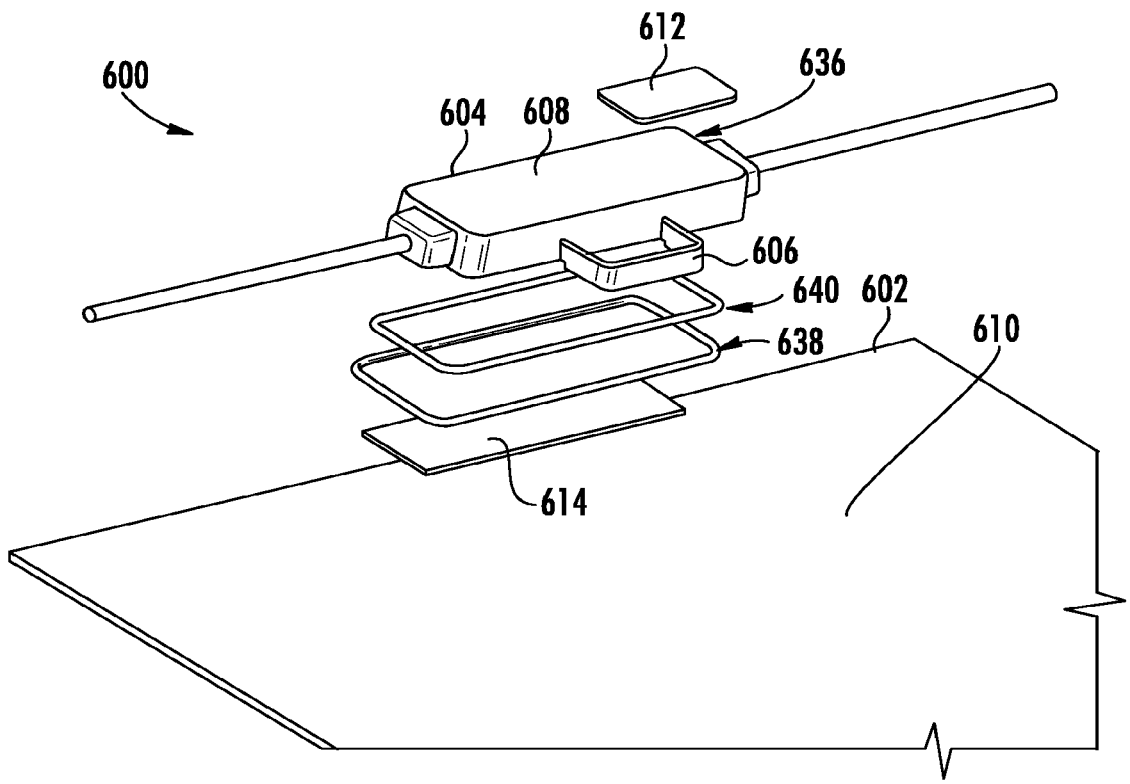
FIGS. 6A and 6B are simplified illustrations of at least one additional embodiment of an ACPV module including a microinverter attached to a substrate of the ACPV module and having a connection chamber incorporated therewith.
Figure 6B:
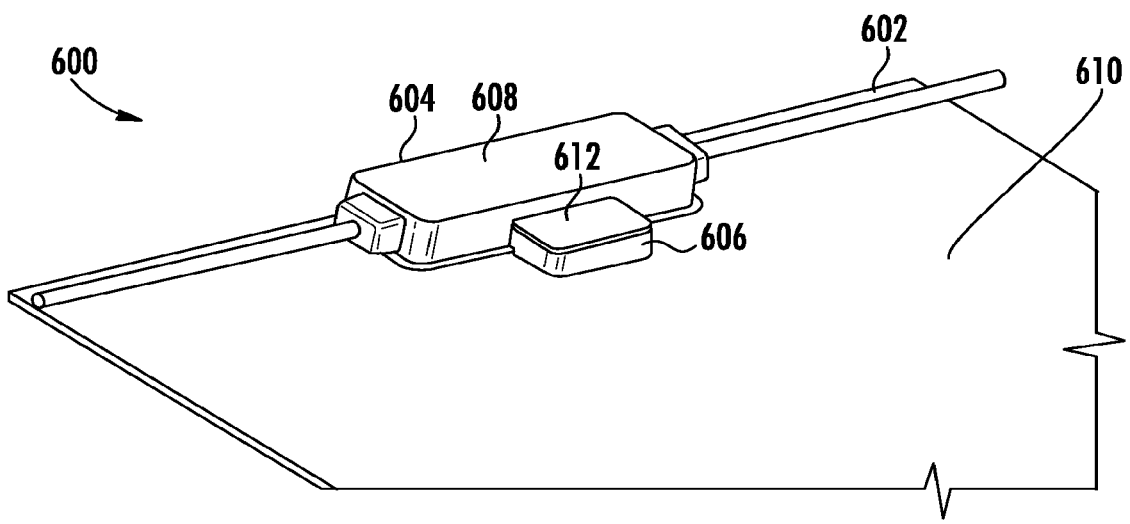

Referring now to FIGS. 6A and 6B, in the illustrative embodiment, an ACPV module 600 includes a PV module 602 and a microinverter 604. The microinverter 604 includes a connection chamber 606 integrated with a housing 608 of the microinverter 604. The connection chamber 606 replaces the typical junction box of the PV module 602. As such, the microinverter 604 is configured to be secured to a back substrate 610 of the PV module 602 in a position such that the electrical connections (not shown) of the PV module 602, which extend from the back substrate 610 and electrically connect to the solar cell array (not shown) of the PV module 602, are received in the connection chamber 606. The connection chamber 606 includes an access door 612 that may be removed to provide access to the electrical connections between the microinverter 604 and the electrical connections of the PV module 602. The connection chamber 606 may also house any bypass diodes and/or other electrical components and/or connections to facilitate easy access to such components/connections.

In the illustrative embodiment, the PV module 602 is a frameless module. In such embodiments, the microinverter 604 may be bonded directly to the back substrate 610 of the PV module 602. For example, the housing 608 may include a base 636 and a cover 638 configured to couple to each other via fasteners or an adhesive and/or thermal coupling, and the cover 638 may be coupled directly to the back substrate 610 via an adhesive pad 614 or other suitable adhesive and/or thermal coupling when the base 636 is coupled to the cover 638 as shown in FIG. 6B. Alternatively, the housing 608 of the microinverter 604 may be secured to the frameless module 602 using clips or other securing mechanisms. To resist migration of fluid between the base 636 and the cover 638, a gasket 640 may be positioned between the base 636 and the cover 638 as shown in FIG. 6A. In those embodiments in which the PV module 602 is embodied as a framed module, the microinverter 604 may be secured to a frame of the PV module 602 in addition to, or instead of, directly to the substrate 610.

Figure 7:
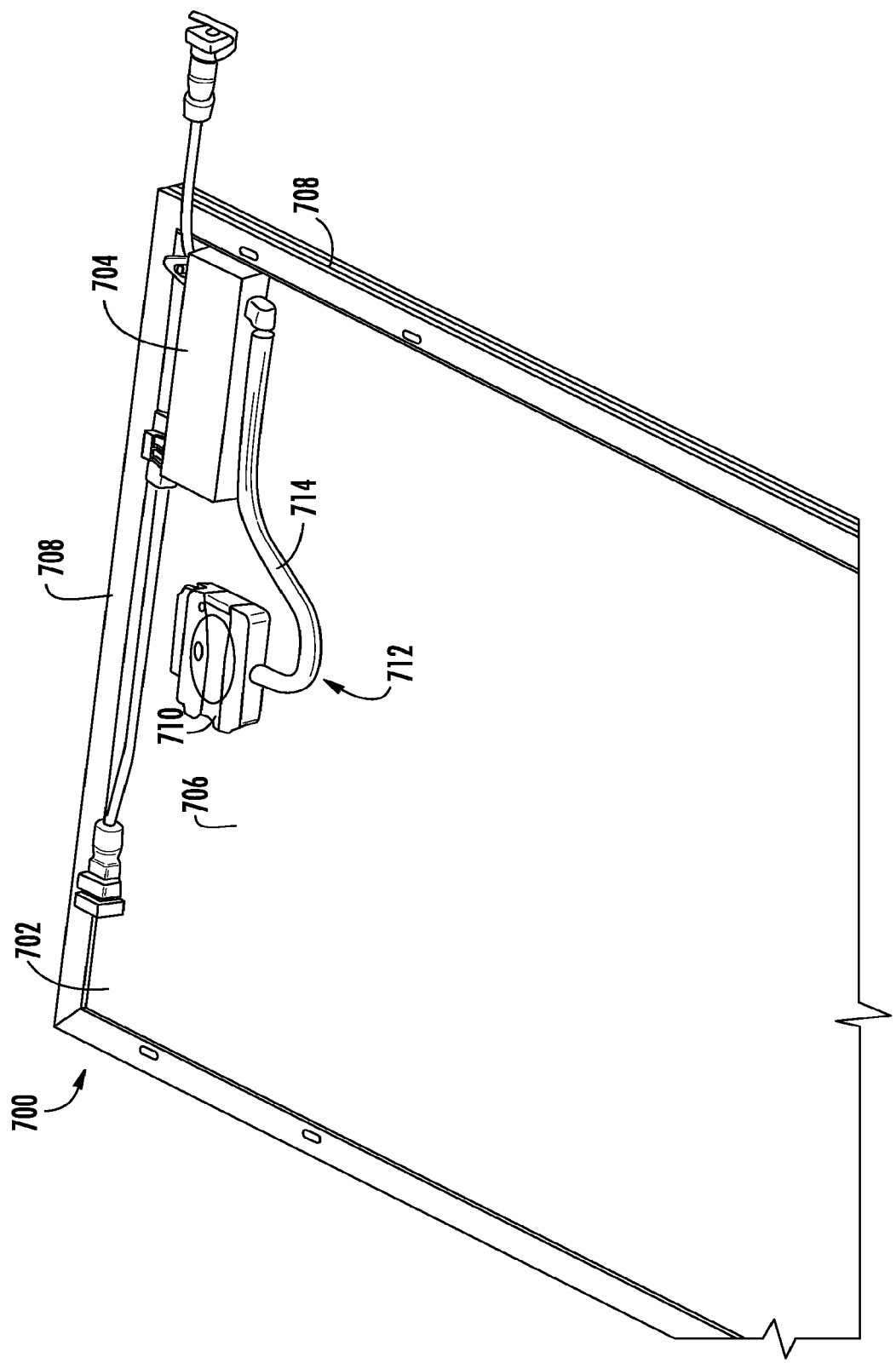
FIG. 7 is a simplified illustration of at least one additional embodiment of an ACPV module including a microinverter attached to a frame of the ACPV module toward a corner of the substrate of the ACPV and electrically connected to a solar array of the ACPV module via a flexible conduit.

Referring now to FIGS. 7 and 8, in the illustrative embodiment, an ACPV module 700 includes a PV module 702 and a microinverter 704 secured to a back substrate 706 of the PV module 702. Illustratively, the microinverter 704 is secured to the PV module 702 toward a corner of a frame 708 of the PV module 702, and may be secured to the frame 708 directly or via an additional supporting bracket as discussed above with regard to the embodiment of FIG. 4. Similar to the embodiment of FIG. 5, the microinverter 704 is directly electrically connected to a junction box 710 of the PV module 702 via DC wires 712. However, in the embodiment of FIG. 7, the DC wires 712 are housed in an outer conduit or corrugated hose assembly 714. The DC wires 712 are fed through the conduit 714 and electrically connect the microinverter 704 and the junction box 710. The conduit 714 is illustratively flexible to reduce concerns associated with the typical rigid mechanical coupling. IL should be appreciated that the conduit 714 provides an additional layer of protection to the DC wires 712, which may reduce the regulatory ratings required for those wires (which typically require double insulation and sunlight resistance properties). Again, as with the embodiment of FIG. 5, the connection between the junction box 710 and the microinverter 704 is formed without the use of DC connectors (e.g., MC-4 connectors), and therefore the connection between the junction box 710 and the microinverter 704 is established through the use of a connector-less DC wire assembly (e.g., DC wires 712) as shown in FIGS. 7 and 8. For instance, the microinverter 704 and junction box 710 may be "hardwired" together such that the DC wires 712 are not capable of being unplugged or disconnected from the junction box 710 or the microinverter 704. The microinverter 704 and junction box 710 may be electrically connected together by soldering, or otherwise electrically connecting, the DC wires 712 within the microinverter 704 and the junction box 710. In some embodiments, an access box or panel (not shown) may be provided in the junction box 710 to allow field service of the ACPV module 700 (e.g., to allow access to the connections of the DC wires 712 within the junction box 710). Additionally or alternatively, the microinverter 704 may include an access panel or box (not shown) to allow field service of the ACPV module 700 (e.g., to allow access to the connections of the DC wires 712 within the microinverter 704).

In the embodiment of FIG. 7, the PV module 702 is embodied as a framed module. In such embodiments, the microinverter 704 may be secured to the frame 708 of the PV module 702 as discussed above. Alternatively, in the embodiment of FIG. 8, the PV module 702 is embodied as a frameless module. In such embodiments, the microinverter 704 may be secured directly to the back substrate 706 of the PV module 702 via a suitable adhesive or thermal coupling and/or mechanical clips or other securing mechanisms. Regardless, because the microinverter 704 is electrically coupled to the junction box 710 via the flexible conduit 714 and DC wires 712, the position of the microinverter 704 relative to the PV module 702 may be modified or adjusted as needed based on the particular implementation. For example, the junction box 710 may be made of substantially the same size and type of material as a standard junction box, such that the degree of modification of the PV module 702 itself (relative to a standard PV module) is small. The assembly of the microinverter 704, the conduit 714, and junction box 710 may be provided as one unit to be connected by the ACPV module integrator, or the pieces may be provided individually.

Figure 9A:
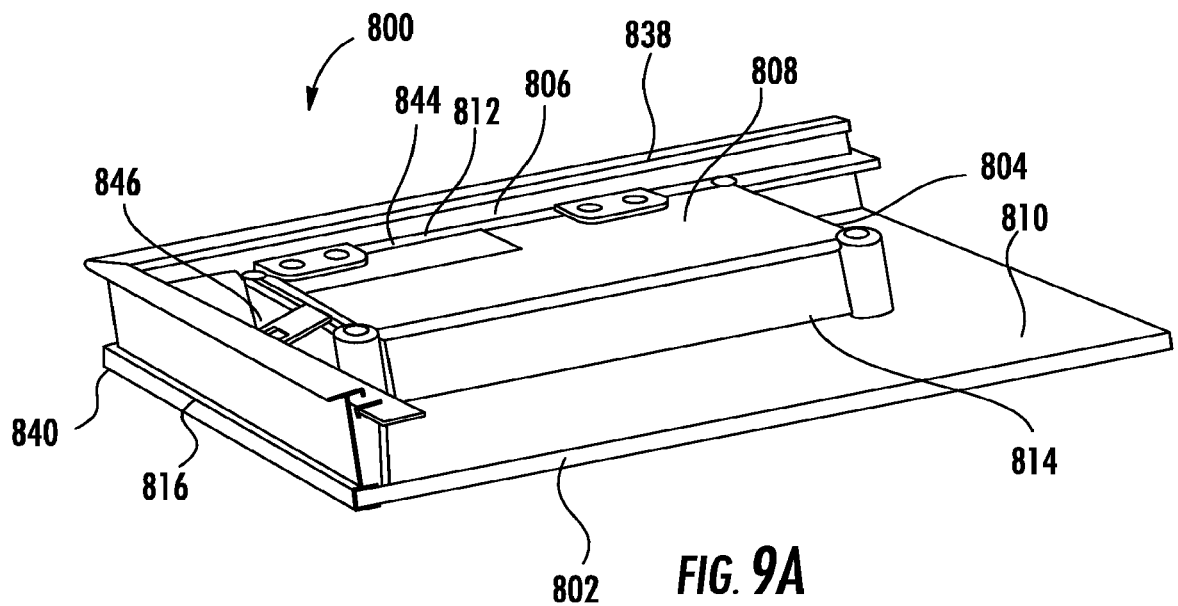
FIGS. 9A and 9B are simplified illustrations of at least one additional embodiment of an ACPV module including a microinverter attached to a frame of the ACPV module toward a corner of a substrate of the ACPV module and having a connection chamber incorporated therewith.
Figure 9B:
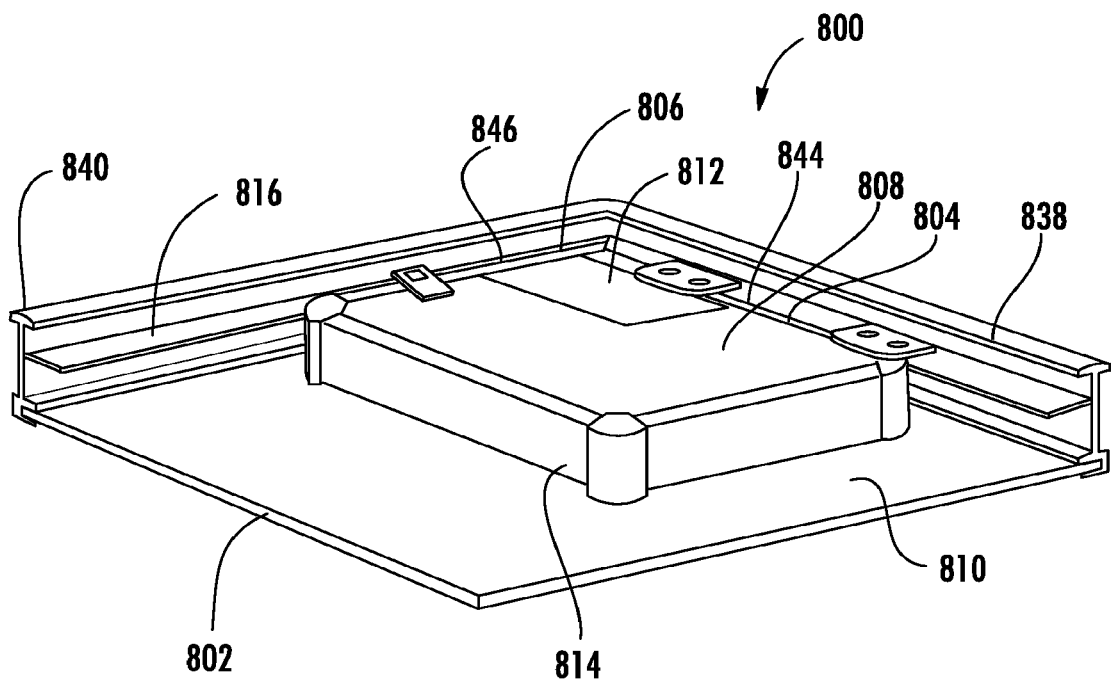

Referring now to FIGS. 9A and 9B, in the illustrative embodiment, an ACPV module 800 includes a PV module 802 and a microinverter 804. The microinverter 804 includes a connection chamber 806 integrated with a housing 808 of the microinverter 804. The connection chamber 806 replaces the typical junction box of the PV module 802. As such, the microinverter 804 is configured to be secured to a back substrate 810 of the PV module 802 in position such that the electrical connections (not shown) of the PV module 802, which extend from the back substrate 810 and electrically connect to the solar cell array (not shown) of the PV module 802, are received in the connection chamber 806. The connection chamber 806 is illustratively arranged to confront a corner of a frame 816 of the PV module 802 as shown in FIGS. 9A and 9B. The connection chamber 806 includes an access door 812 that may be removed to provide access to the electrical connections between the microinverter 804 and the electrical connections of the PV module 802. The connection chamber 806 may also house any bypass diodes and/or electrical components and/or connections to facilitate easy access to such components/connections.

The PV module 802 includes the frame 816 as shown in FIGS. 9A and 9B. The microinverter 804 is secured to the frame 816 of the PV module 802 toward the corner of the frame 816 defined by first and second frame members 838, 840 as best seen in FIG. 9B. The housing 808 includes a plurality of mounting flanges 818 extending outwardly therefrom which facilitate attachment of the microinverter 804 to the frame 816. Specifically, two mounting flanges 818 extend outwardly from a first side 844 of the housing 808 confronting the frame member 838, and one mounting flange 818 extends outwardly from a second side 846 of the housing 808 confronting the frame member 840. The sides 844, 846 of the housing 808 extend perpendicular to one another, and the connection chamber 806 is adjacent to an edge (not shown) of the housing 808 defined by the intersection of the sides 844, 846. Each of the mounting flanges 818 includes an aperture sized to receive one of a plurality of fasteners (not shown), and the frame 816 similarly includes a plurality of apertures (not shown) sized to receive the fasteners. The fasteners are inserted into the respective apertures of the mounting flanges 818 and the frame 816 to attach the housing 808 of the microinverter 804 to the frame 816. It should be appreciated, however, that an adhesive and/or thermal coupling may be used to attach the flanges 818 to the frame 816 in place of the fasteners. In any case, the frame 816 supports the microinverter 804 in position above the back substrate 810. To laterally stabilize the microinverter 804 relative to the PV module 802, the microinverter 804 may be additionally bonded directly to the back substrate 810 of the PV module 802. For example, the housing 808 may be coupled directly to the back substrate 810 via an adhesive pad 814 as shown in FIG. 9B or other suitable adhesive and/or thermal coupling. Alternatively, the housing 808 of the microinverter 804 may be secured to the back substrate 810 using clips or other securing mechanisms.

Figure 10A:
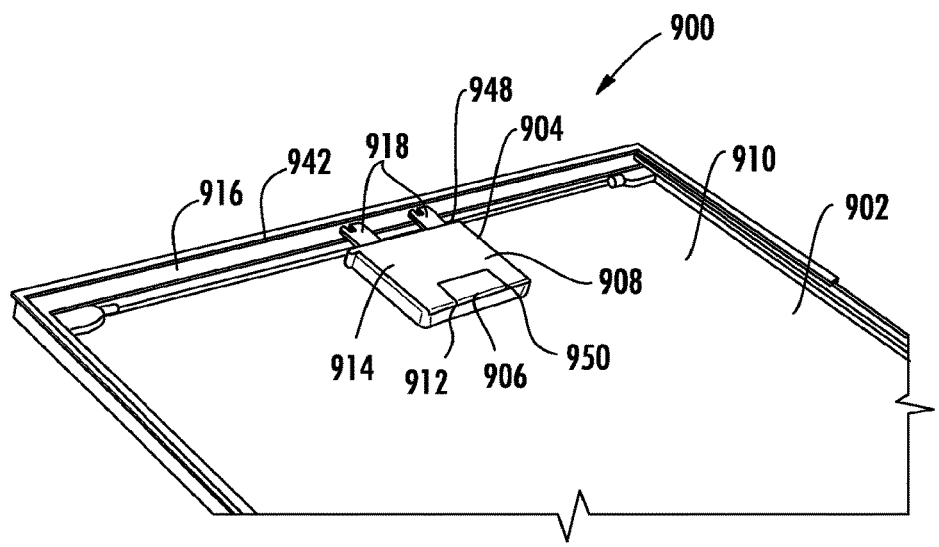
FIG. 10A is a simplified illustration of at least one additional embodiment of an ACPV module including a microinverter attached to a frame of the ACPV module so that the microinverter is centered between two corners of the frame of the ACPV module and having a connection chamber incorporated therewith.

Referring now to FIG. 10A, in the illustrative embodiment, an ACPV module 900 includes a PV module 902 and a microinverter 904. The microinverter 904 includes a connection chamber 906 integrated with a housing 908 of the microinverter 904. The connection chamber 906 replaces the typical junction box of the PV module 902. As such, the microinverter 904 is configured to be secured to a hack substrate 910 of the PV module 902 in position such that the electrical connections (not shown) of the PV module 902, which extend from the back substrate 910 and electrically connect to the solar cell array (not shown) of the PV module 902, are received in the connection chamber 906. The connection chamber 906 is illustratively arranged along a first side 950 of the housing 908 to confront a general center of the substrate 910 of the PV module 902 as shown in FIG. 10A. The connection chamber 906 includes an access door 912 that may be removed to provide access to the electrical connections between the microinverter 904 and the electrical connections of the PV module 902. The connection chamber 906 may also house any bypass diodes and/or electrical components and/or connections to facilitate easy access to such components/connections.

The PV module 902 includes a frame 916 as shown in FIG. 10A. The microinverter 904 is secured to the frame 916 of the PV module 902 so that the microinverter 904 is generally centered between two corners of the frame 916. The housing 908 includes a plurality of mounting flanges 918 extending outwardly therefrom which facilitate attachment of the microinverter 904 to the frame 916. Specifically, the mounting flanges 918 extend outwardly from a second side 948 of the housing 908 positioned opposite the first side 950 of the housing 908. Each of the mounting flanges 918 includes an aperture sized to receive one of a plurality of fasteners (not shown), and the frame 916 similarly includes a plurality of apertures (not shown) sized to receive the fasteners. The fasteners are inserted into the respective apertures of the mounting flanges 918 and the frame 916 to attach the housing 908 of the microinverter 904 to the frame 916. It should be appreciated, however, that an adhesive and/or thermal coupling may be used to attach the flanges 918 to the frame 916 in place of the fasteners. Regardless of the attachment mechanism, the frame 916 supports the microinverter 904 in position above the back substrate 910 such that substantially all of the weight of the microinverter 904 is supported by the frame 916. As such, the net force applied by the microinverter 904 to the back substrate 910 is substantially zero. Additionally, to laterally stabilize the microinverter 904 relative to the PV module 902, the microinverter 904 may be bonded directly to the back substrate 910 of the PV module 902. For example, the housing 908 may be coupled directly to the back substrate 910 via an adhesive pad 914 as shown in FIG. 10A or other suitable adhesive and/or thermal coupling. Alternatively, the housing 908 of the microinverter 904 may be secured to the back substrate 910 using clips or other securing mechanisms.

Figure 10B:
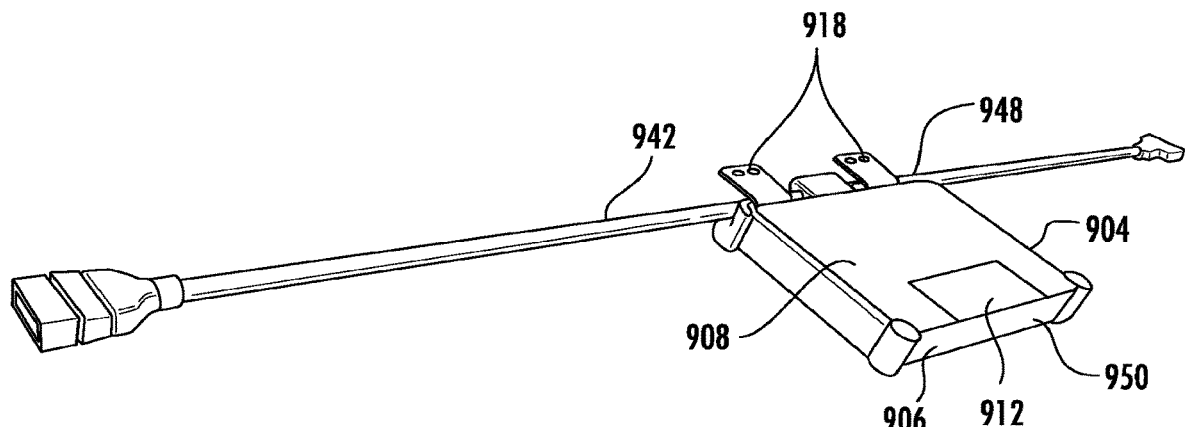
FIG. 10B is a simplified illustration of the microinverter of FIG. 10A detached from the frame of FIG. 10A.

Referring now to FIG. 10B, the microinverter 904 is shown detached from the frame 916 of the PV module 902 (note that the frame 916 is not shown) to better illustrate features of the microinverter 904. In contrast to FIG. 10A, in which an alternating current (AC) output cable 942 of the microinverter 904 extends between the two corners of the frame 916, the AC output cable 942 of the detached microinverter 904 extends freely beyond opposite ends of the housing 908 as shown in FIG. 10B. Of course, it should be appreciated that in other embodiments, other interconnection cable assemblies, such as a trunk-and-drop cable assembly, may be utilized to electrically connect to the microinverter 904.

Various technologies for integrating a microinverter with a PV module have been illustrated in the Figures and described above. Although particular features have been shown and described with regard to particular embodiments, it should be appreciated that features of various embodiments may be mixed and matched as each implementation may require. For example, in some embodiments, a "standardized" microinverter may be desired for use with a variety of PV modules (which may vary in frame size and/or placement of electrical connections/junction box). Additionally, it may be desirable to uniformly locate features of the PV module (e.g., the junction box) across different PV modules for ease of manufacturability or certification. In such embodiments, features of the various disclosed embodiments may be selected to adapt the microinverter to each PV module as desired.

An ACPV module having desired capabilities or features may be generated by providing various couplings between a PV module and a microinverter. Specifically, the various couplings provided may differ from one another in certain mechanical, electrical, and thermal aspects. In one example, the PV module and the microinverter may be mechanically coupled to one another as follows: the microinverter may be attached to the frame of the PV module via screws or other fasteners, the microinverter may be attached to the frame of the PV module via clips, the microinverter may be attached to a laminate of the frameless PV module via clips, the microinverter may adhere directly to a backsheet of the PV module, and/or the microinverter may be attached to the PV module via an intermediate mechanical coupling. In another example, the PV module and the microinverter may be electrically coupled to one another as follows: via rigid DC connectors, via MC-4 DC connectors and wires, via a direct wired connection serviceable inside a junction box of the PV module, via a direct wired connection serviceable inside the microinverter, via a direct wired connection sheathed in a conduit or hose, and/or via a direct soldered connection. In yet another example, the PV module and the microinverter may be thermally coupled to one another as follows: an air gap may be provided between the microinverter and a backsheet of the PV module, a thermal pad or paste may be provided between the microinverter and the backsheet of the PV module, and/or a non-conducting adhesive layer may be provided between the microinverter and the backsheet of the PV module. It should be appreciated that selection of the various features may produce an ACPV module having unique features that may not be depicted in any of the FIGS. 1-10, but which are nevertheless disclosed by the coupling examples above. As such, the associated Figures depict only a few embodiments of the various possible combinations of features that may be selected and one of ordinary skill in the art should appreciate the additional variations that may be produced by providing one or more of the mechanical, electrical, and thermal couplings discussed above.

The invention claimed is:

1. An alternating current photovoltaic (ACPV) module comprising:
   a photovoltaic (PV) module, the PV module having a perimeter frame, the perimeter frame extending away from a back surface of the PV module, the PV module having a DC output connector, the DC output connector secured to the back surface of the PV module; and
   a microinverter positioned in a housing, the housing configured to electrically connect the DC output connector to a DC input connector electrically connected to the microinverter, the housing having a plurality of external tabs, the external tabs positioned to meet a corresponding aperture of a plurality of apertures positioned on the perimeter frame,
   wherein the corresponding external tabs and apertures of the plurality of apertures are each secured together with a fastener, and
   wherein a separate mounting bracket, to secure the microinverter to the perimeter frame, is not employed; and
   wherein a separate docking member to retain the housing is not employed.

2. The ACPV module of claim 1 wherein the perimeter frame is rectangular in shape, the housing has a side parallel to a side of the perimeter frame, and one or more of the plurality of external tabs serve to ground the microinverter to the perimeter frame.

3. The ACPV module of claim 1 wherein the DC output connector extends upwardly from the back surface of the PV module.

4. The ACPV module of claim 1 wherein the back surface of the PV module further comprises a junction box, the junction box having a portion connected to the DC output connector.

5. The ACPV module of claim 4 wherein the DC input connector of the housing is configured to overlap at least a portion of the junction box and at least a portion of the DC output connector when the housing is secured to the perimeter frame with the plurality of external tabs.

6. The ACPV module of claim 4 wherein the DC input connector of the housing is configured to overlap at least a portion of the DC output connector when the housing is secured to the perimeter frame with the plurality of external tabs.

7. The ACPV module of claim 1 wherein the DC input connector extends towards the back surface of the PV module when the housing is secured to the perimeter frame with the plurality of external tabs.

8. The ACPV module of claim 1, wherein each of the external tabs includes an aperture sized to receive a corresponding fastener.

9. The ACPV module of claim 1, wherein the housing is an elongated housing.

10. The ACPV module of claim 1, wherein the connection between the DC ouput connector and the DC input connector is a vertical connection.

* * * * *